(12) United States Patent
Unger et al.

(10) Patent No.: US 11,870,435 B2
(45) Date of Patent: Jan. 9, 2024

(54) CONTROL CIRCUIT AND METHOD FOR CONTROLLING A DATA INPUT/OUTPUT

(71) Applicant: Infineon Technologies AG, Neubiberg (DE)

(72) Inventors: Markus Unger, Unterhaching (DE); Johannes Pummerer, Rosenheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/979,250

(22) Filed: Nov. 2, 2022

(65) Prior Publication Data

US 2023/0134947 A1    May 4, 2023

(30) Foreign Application Priority Data

Nov. 3, 2021 (DE) ..................... 10 2021 128 636.0

(51) Int. Cl.
*H03K 17/12* (2006.01)
*H03K 17/687* (2006.01)
*H03K 19/0175* (2006.01)

(52) U.S. Cl.
CPC ..... *H03K 17/6872* (2013.01); *H03K 19/0175* (2013.01); *H03K 2217/9658* (2013.01)

(58) Field of Classification Search
CPC ...... H03K 17/10; H03K 17/102; H03K 17/12; H03K 17/122; H03K 17/16; H03K 17/161; H03K 17/687; H03K 19/00346; H03K 19/00361; H03K 19/0175; H03K 19/0185; H03K 19/018507; H03K 2217/9658
See application file for complete search history.

(56) References Cited

U.S. PATENT DOCUMENTS

| 6,051,995 | A | 4/2000 | Pollachek |
| 7,095,258 | B2 * | 8/2006 | Deutschmann .......... H03K 5/08 327/112 |
| 9,495,317 | B2 * | 11/2016 | Metzner ............... G06F 13/4022 |
| 2015/0169488 | A1 | 6/2015 | Metzner et al. |

FOREIGN PATENT DOCUMENTS

| DE | 69927911 T2 | 7/2006 |
| DE | 102014118156 A1 | 6/2015 |

* cited by examiner

*Primary Examiner* — Long Nguyen
(74) *Attorney, Agent, or Firm* — Eschweiler & Potashnik, LLC

(57) ABSTRACT

A control circuit for controlling a data input/output is provided. The control circuit comprises a plurality of control level circuits that include a first control level circuit and a last control level circuit. Each control level circuit has a control element, with a number of control elements of the last control level circuit being greater than a number of control elements of the first control level circuit. Each control element is configured to receive a first control signal and a second control signal, and controls a current for the data input/output depending on the first and second control signals. The control circuit is configured to provide the first control signal to the control elements in a sequence starting at the first control level circuit and ending at the last control level circuit, and then to provide the second control signal to the last control level circuit in reverse order.

20 Claims, 7 Drawing Sheets

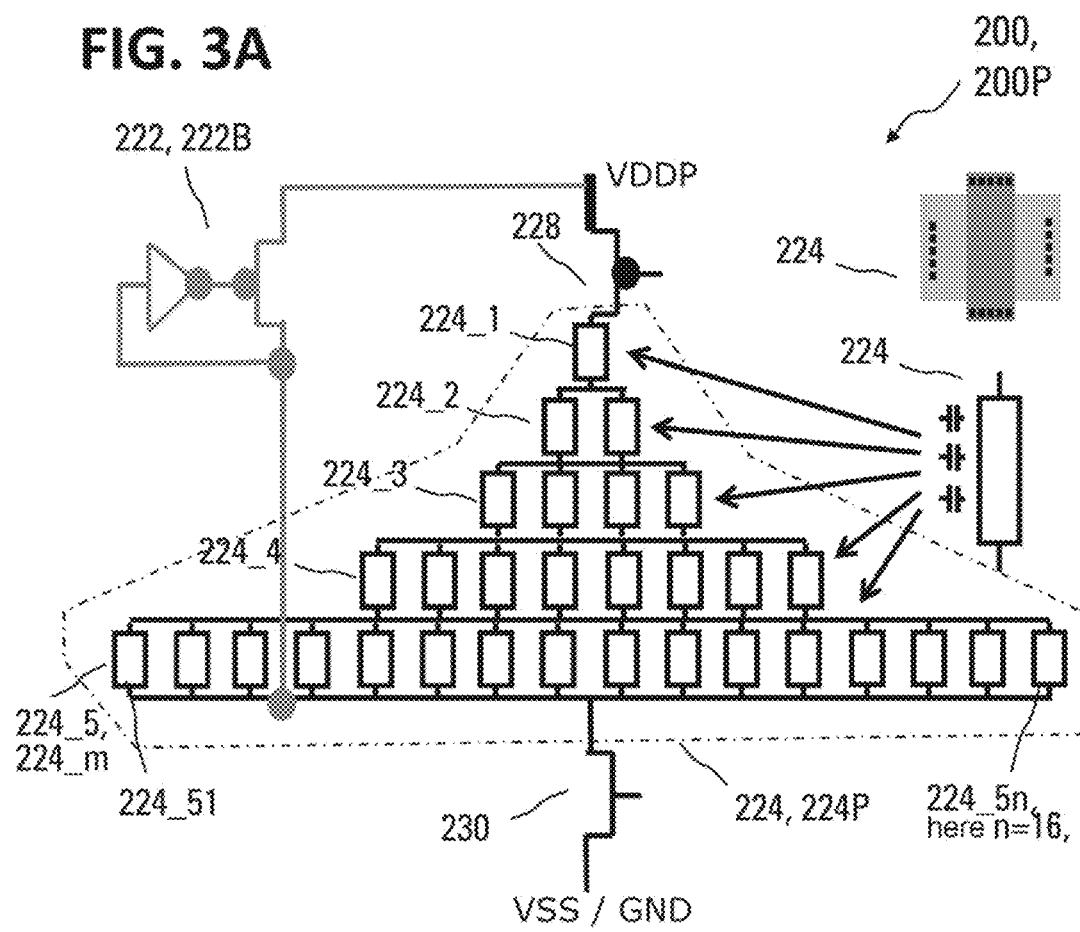
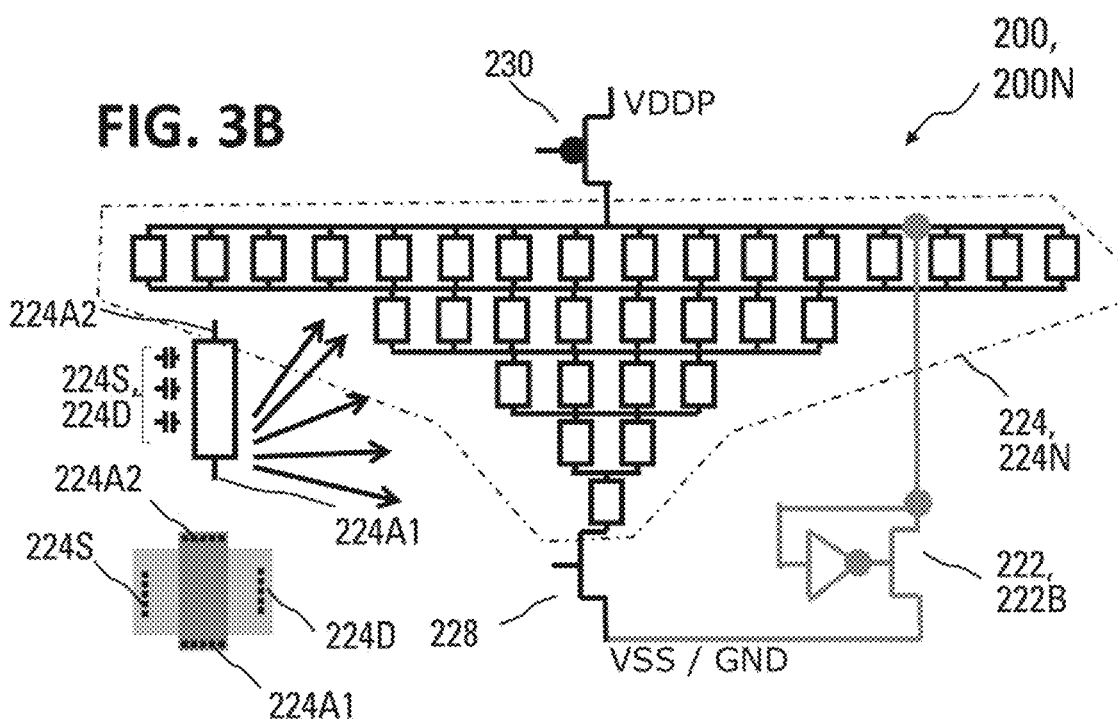

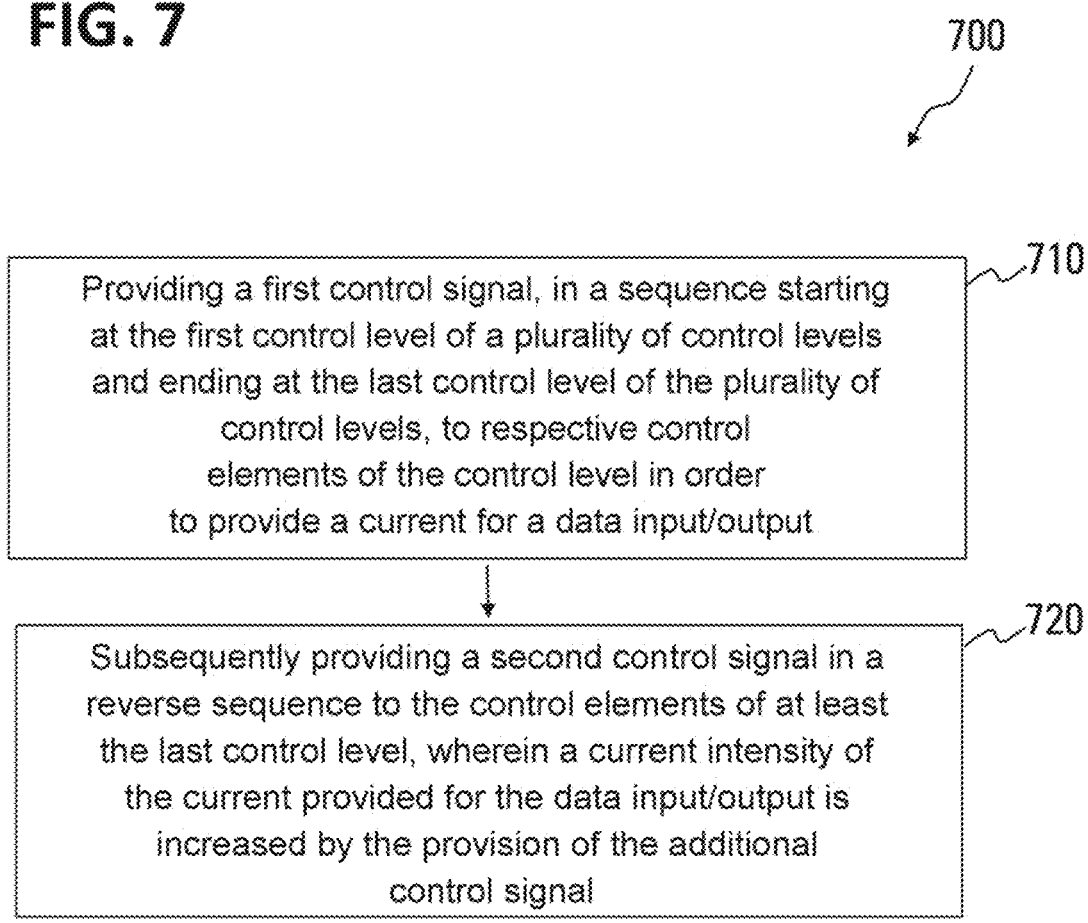

CONTROL CIRCUIT AND METHOD FOR CONTROLLING A DATA INPUT/OUTPUT

REFERENCE TO RELATED APPLICATIONS

This application claims priority to German Application 10 2021 128 636.0, filed on Nov. 3, 2021. The contents of the above-referenced Patent Application is hereby incorporated by reference in its entirety.

TECHNICAL FIELD

The disclosure relates to a control circuit and a method for controlling a data input/output.

BACKGROUND

During a data input/output operation, a signal is typically switched between (at least) two states, e.g. between a low-level potential and a high-level potential, for example, by means of transistors. Such a data signal can be provided, for example, at a data input/output pad or a contactless data input/output element.

FIG. 1A shows two ideal curves of such a data signal.

The dashed line represents a square wave signal 102 which switches between a low-level potential and a high-level potential with no delay, and after switching keeps the voltage constant via a variation of the current strength (low level output current and high level output current). This enables an instantaneous switching between the two states. After the network node (transmitter-to-receiver line) is recharged, the current used to define the logical level drops to the current that is required to maintain the level (transmitter and receiver leakage current and/or weak pull-up/down current to define the receiver input voltage level for the case of transmitter in tristate mode).

The abrupt current change which precedes a voltage potential change of the network node (transmitter to receiver line, capacitive network node), leads to a strong (unwanted) electromagnetic emission (EME), which when coupled in (galvanically on the power supply of the transmitter and receiver or field-coupled via the conductor loop on the circuit board) will generate a noise signal (interfering power).

Such an electromagnetic emission generally occurs during transistor switching operations and depends on internal wiring (processor energy), driver strength (i.e. a current intensity that is supplied), switching frequency and the load consumption (capacitive, resistive, inductive).

The solid line 104 represents a sinusoidal switching curve of the signal 102 between the low-level voltage and the high-level voltage. The smooth continuous current intensity waveform (current differential, rate of change of current per time) of the voltage level switching reduces the electromagnetic emissions, since a sinusoidal waveform does not generate any frequency harmonics (only the fundamental). However, after a switching command, the target state (e.g. reaching the maximum or minimum voltage) is only reached after a time delay, which is typically also undesirable because it is generally desirable to provide as short switching times as possible (to reach the new level state quickly (high data rates/frequencies)).

FIG. 1B shows a real switching current signal 106, which occurs when a data input/output is switched from a low voltage level to a high voltage level.

As is clear from a comparison of the real signal 106 of FIG. 1B with the ideal signals of FIG. 1A, the real signal 106 represents an intermediate case between the two ideal signals, in particular during the rise: the rise does not occur as abruptly as in the square wave signal 102, but also not as smoothly as in the sinusoidal signal 104. Thus, the real signal 106 represents a compromise between a (lowest possible) switching speed and an (also lowest possible) electromagnetic emission.

According to the latest designs, however, the data input/output requires such high switching frequencies with such high power consumption that the electromagnetic emission can be above acceptable limits, e.g. above customer-specified limits or, for example, above legally prescribed limits for electromagnetic compatibility (EMC).

There is therefore a need for a data input/output with switching times as short as possible while complying with limits for electromagnetic emission (e.g. EMC limits).

BRIEF DESCRIPTION OF THE DRAWINGS

Exemplary embodiments of the disclosure are shown in the drawings and will be explained in more detail in the following.

In the drawings

FIGS. 3A and 3B each show a schematic representation of a control circuit according to various exemplary embodiments;

FIG. 7 shows a flowchart of a method for controlling a data input/output according to various exemplary embodiments.

DESCRIPTION

Figure 1A:
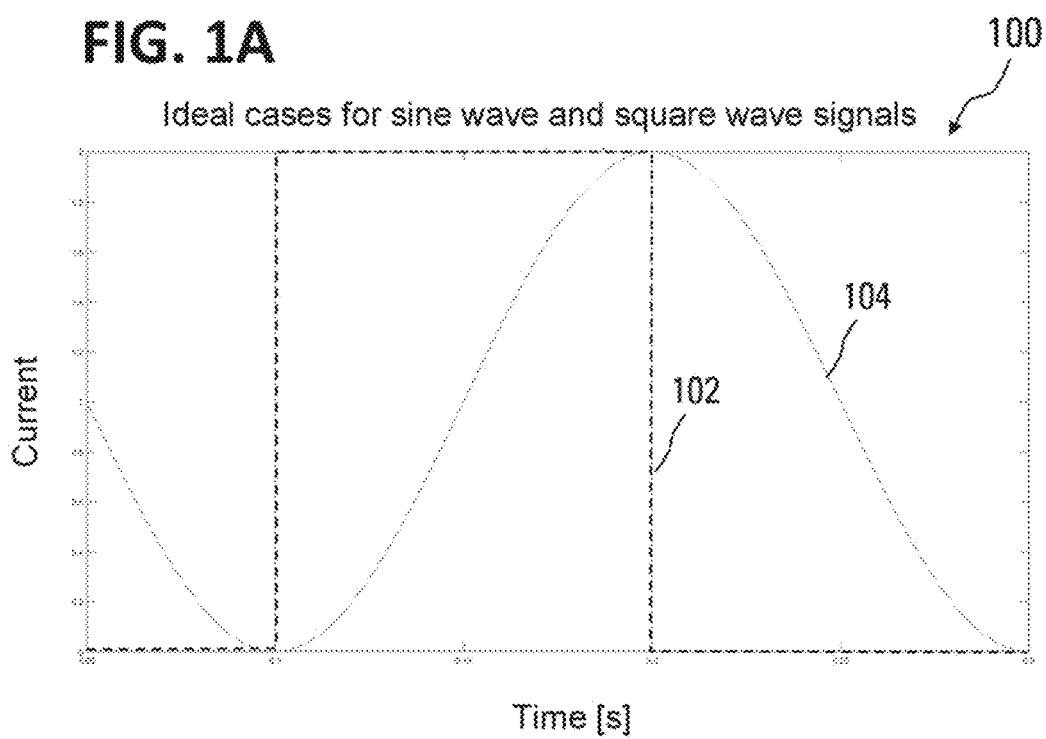
FIG. 1A shows ideal cases of two types of data signals.

In the detailed description that follows, reference will be made to the attached drawings, which form part of this description and in which specific embodiments in which the disclosure may be realized are shown for illustration purposes. In this respect, directional terms such as "at the top", "at the bottom", "in front", "behind", "frontal", "rear", etc. are used with respect to the orientation of the figures being described. Because components of embodiments can be positioned in a number of different orientations, the directional terminology is used for illustration purposes only, and is in no way restrictive. It is understood that other embodiments can be used and structural or logical changes can be made without departing from the scope of protection of the present disclosure. It goes without saying that the features of the various exemplary embodiments described herein can be combined with one another, unless specifically stated otherwise. The following detailed description is therefore not to be understood in a restrictive sense, and the scope of protection of the present disclosure is defined by the attached claims.

For the purposes of this description, the terms "connected" and "coupled" are used to describe both a direct and an indirect connection, as well as a direct or indirect coupling. In the figures, identical or similar elements are labeled with identical reference numerals, where this is appropriate.

As explained above, switching a current for data input/output typically results in electromagnetic emission, especially during the generation of a (possibly steep) current edge and possibly at other points of the current curve.

In various exemplary embodiments a control circuit and a method for controlling data input/output are provided, which allows electromagnetic emissions caused by the switching process to be minimized despite short switching times.

When switching a current for data input/output (also called driver current or driven current) from a minimum value to a maximum value, in various exemplary embodiments the current change near the minimum (start of the level change) or maximum value (66% value of the final level value) can be lower than in other approaches, and close to a mean value between the minimum and the maximum value (50% value of the level change, steepest current rise to switch the voltage level) it can be higher than in other approaches.

The control circuit in various exemplary embodiments can be configured to implement a gradual increase in the current intensity at the beginning (only a few parts of the switching stage active), a steep, fast current rise ("boost") in the middle (all parts of the switching stage active) and a gradual flattening of the current rise toward the end of a switching process (asymptotic approximation of the level with capacitive loads due to reducing charging currents) from a low-current data signal to a high-current data signal.

For this purpose, according to various exemplary embodiments, a staged activation of control elements, some of which are connected in parallel, e.g. current control elements (e.g. split transistors, so-called transistor fingers) can be used.

For example, —in a graphical illustration—the control elements can be provided in a fir tree-shaped configuration, according to which, starting at the top of the tree (e.g. one or two transistor fingers of the main transistor), an increasing number of control elements connected in parallel (transistor fingers of the main transistor) are part-activated in successive switching steps. This switching behavior from one/two transistor fingers of the main transistor delayed via the parasitic gate resistances and gate capacitances to the next instance (doubling of the number of transistor fingers of the main transistor) and the additional interconnection (usually always a further doubling) of the instances up to a depth of 4 instances generates a controlled, avalanche-like increase in the switching current.

During a transition from a partial switched state to a complete switched state, the control elements (transistor fingers of the main transistor) are also activated from the opposite end—using the fir tree image, from the base of the tree to the top of the tree.

This double-sided switching of the transistor finger gates of the main transistor achieves a more stable and faster activation state than the activation definition from the top of the fir tree.

The base connection of the fir tree has the more direct transistor finger gate control of the main transistor (lower gate-voltage drop due to parallel connection of the transistor finger elements).

Accordingly, immediately after the control level circuit with the most numerous control elements connected in parallel (at the base of the fir tree) has been partially switched, the complete switching of these most numerous control elements takes place. This is equivalent to a boost mode, in which the current intensity increases strongly within a short time, whereas the partial activation of fewer control elements at the beginning and end of the switching process can implement the gradual increase in the current.

Thus, the capacitive load can be recharged in a close approximation to a sine/cosine function of the switching current, thus reducing harmonic oscillations which would lead to electromagnetic emissions that could be radiated and/or fed into the control circuit as noise/interfering power, the data input/output pad (e.g. a high-speed data interface port) or similar.

The low-emission shape of the driver current curve, realized based on a control characteristic of the control elements, makes it possible to dispense with additional circuit elements such as RC elements or to reduce their number and/or to prevent the control elements (e.g. standardized transistor finger elements) from being affected by strong electromagnetic emissions. Even with additional circuits, which can be located together with the control circuit on the same printed circuit board (PCB), for example, the need to filter out the electromagnetic emission potentially received can be reduced so that components, and thus chip space and weight, can be saved.

Figure 1B:
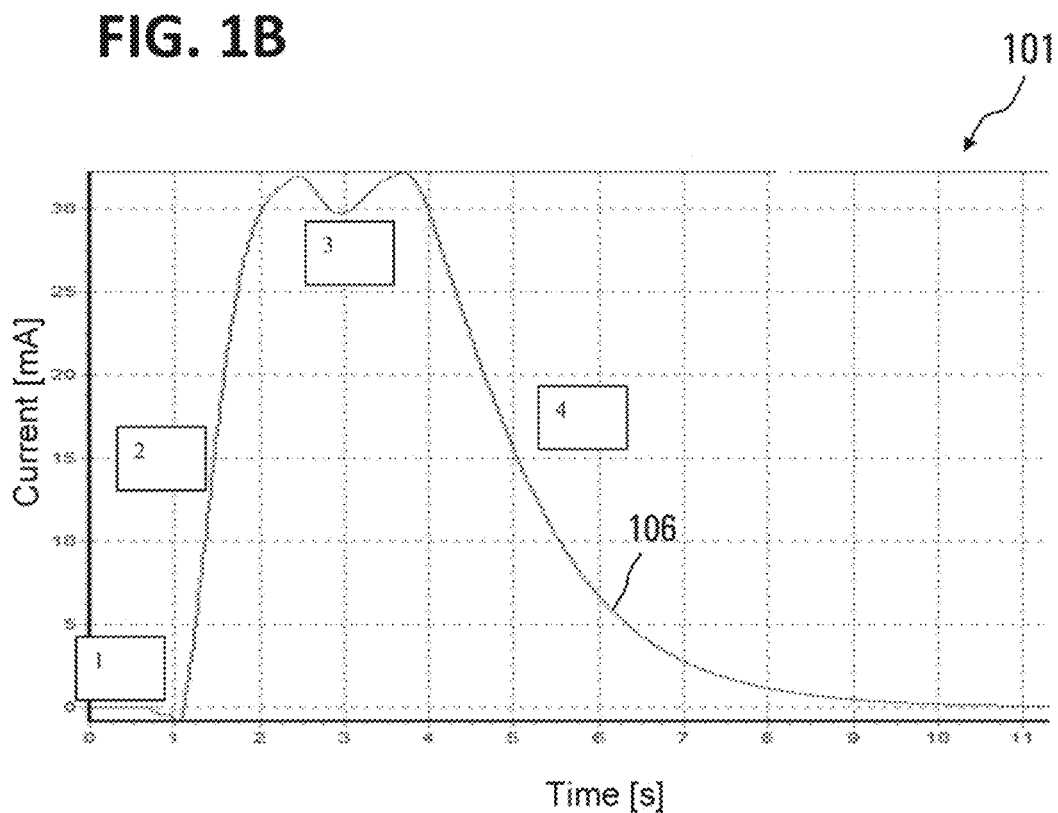
FIG. 1B shows an example of a real data signal.

In FIG. 1B such points are numbered in the current curve.

Switching on (labeled with 1) may have the greatest impact on the emission. Particularly when the switching on occurs very fast, an emission potential can be enormously high (harmonic oscillations of the fundamental frequency), because a capacitive load at the data input can behave like a short-circuit at the driver transistor (wherein the on resistance $R_{DSon}$ between source and drain of the transistor can limit a peak current when the device is switched on).

An ideal activation behavior (with regard to emissions) would result in a sinusoidal or cosine-shaped signal. In this case, the on resistance of the transistor would be correspondingly changed from the initial state (1 in FIG. 1B; the desired optimal curve is not achieved in FIG. 1B, the comparison with FIG. 1B and the labels 1 to 4 used there are only given for better understanding and orientation along the current curve) to a state with low resistance (labeled 2 in FIG. 1B). In the vicinity of the region labeled 2, a current rate of change can reach its maximum value (similar to the situation for a sine/cosine signal).

At the point labeled 3, the maximum current can be supplied and the on resistance $R_{DSon}$ is minimized.

During a transition from the region labeled 3 to the region labeled 4, a current rate of change can be limited by saturation of the capacitive load.

The above-described design of a control circuit with staggered partial activation and subsequent full activation of sequentially switched groups of parallel connected control elements ("fir tree design") was developed with the aim of generating a smooth switching behavior (capacitive short-circuit, therefore minimum number of transistor fingers of the main transistor active) in the phase labeled 1, and to generate a sufficiently strong signal sufficiently quickly (boosting the base of the fir tree of the transistor fingers of the main transistor) in phase 3, in order to provide a fast switching behavior on the one hand and to generate a signal insensitive to noise/interfering power on the other hand (so that the logical value assigned to the current signal value is stable).

In various exemplary embodiments, a high switching frequency with low electromagnetic emission can be provided by means of a special intelligent switching sequence of the control elements of the control circuit for data input/output.

Expressed differently, all control elements are neither switched simultaneously nor all switched one after the other, rather a switching sequence is implemented in which initially a small number of control elements (e.g. a single one) in a first control level circuit is switched to least partially conductive for a driven current, and then, in a second control level, a larger number (i.e. larger than in the first control level) circuit of control elements (e.g. at least two) is switched to be partially conductive at the same time. In other words, a number of simultaneously switched control elements is increased in a chronological sequence, for example, in the manner of a cascade or avalanche.

In various exemplary embodiments, more than two control level circuits can be provided, for example, at least three control level circuits, for example, four or five control level circuit.

In a reverse switching sequence, the control elements of the control level circuits can subsequently be switched in such a way that their current conductivity is further increased, for example to a maximum possible conductivity for them.

In other words, a resistance of the control elements in the "forward" switching process (with the number of control elements per control level circuit increasing) can be reduced, and in the "reverse" switching process in the opposite direction the resistance ($R_{DSon}$ of the main driver transistor) can be further reduced.

In various exemplary embodiments, providing a first control signal to the control elements of the last control level circuit in a first direction (the forward direction) can trigger the provision of a second control signal to the control elements of the last control level circuit (and, if applicable, the additional control level circuits up to the first control level circuit) in a second direction (the reverse direction).

The control elements in different exemplary embodiments can have the same structure, e.g. as (e.g. standardized or in a standardized in a similar way) transistor fingers.

Figure 2:
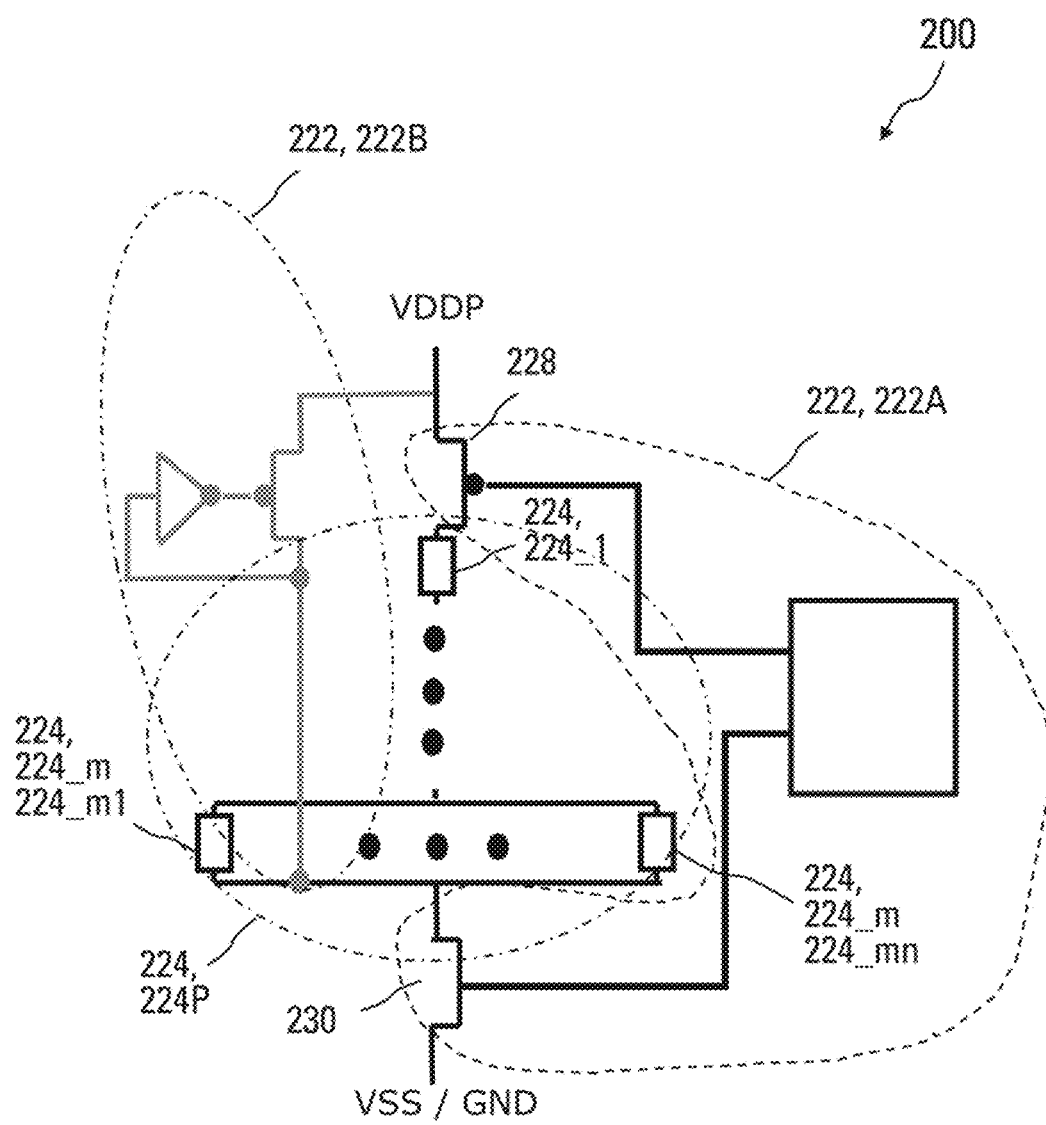
FIG. 2 shows a schematic representation of a control circuit according to various exemplary embodiments.
Figure 4:
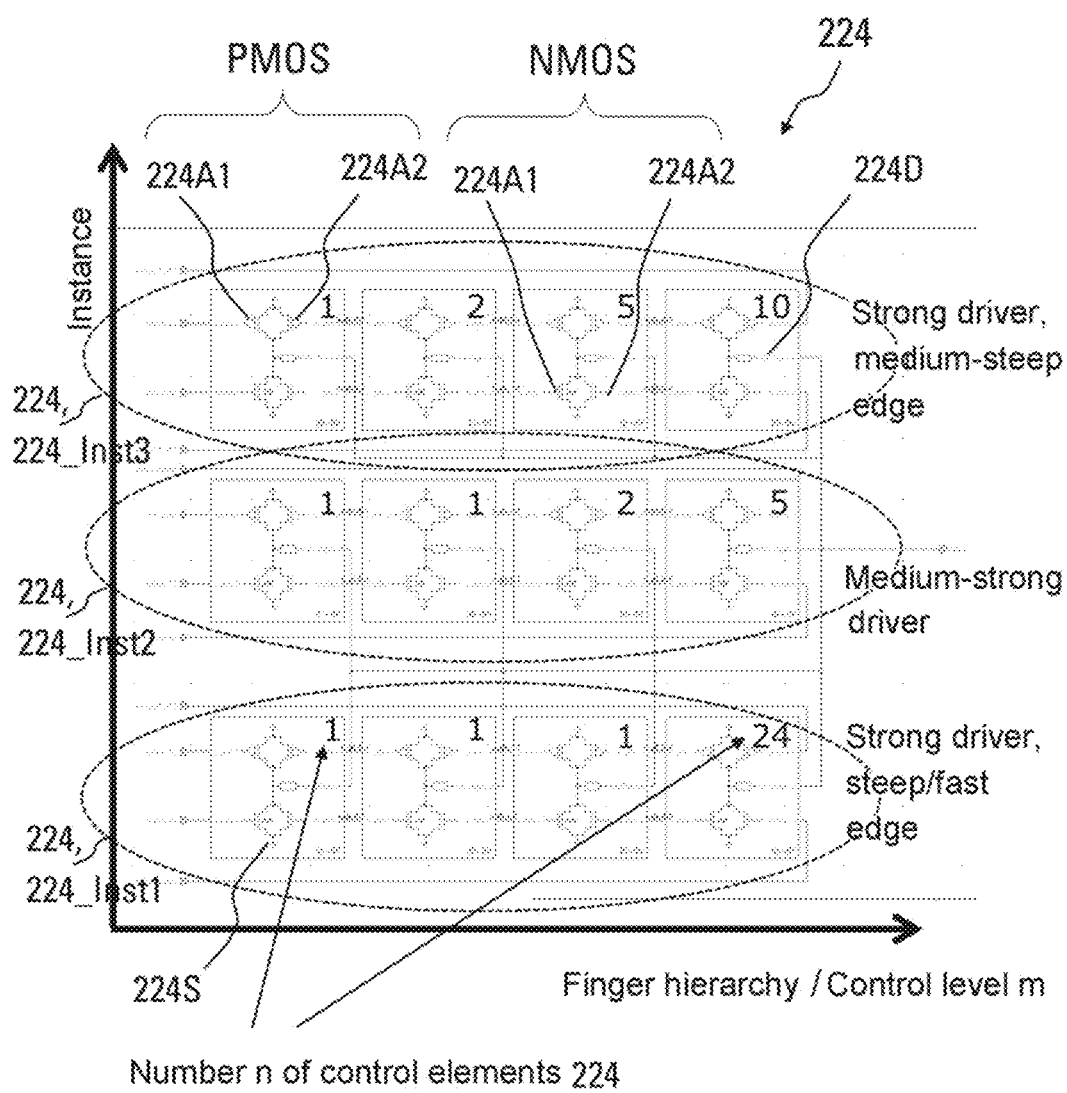
FIG. 4 shows a schematic representation of control element arrangements according to various exemplary embodiments.
Figure 5:
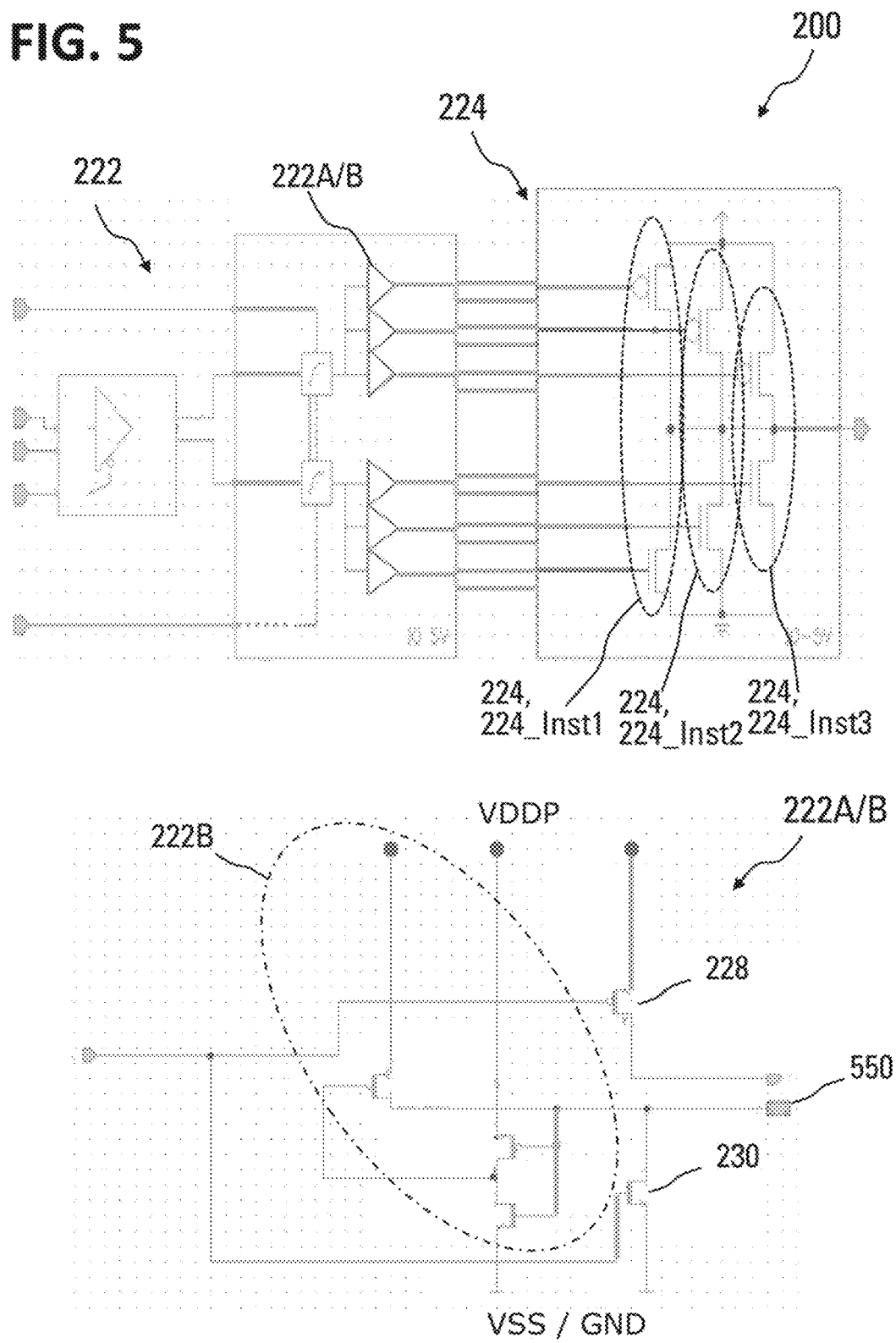
FIG. 5 shows a schematic representation of a control circuit according to various exemplary embodiments.

FIGS. 2, 3A and 3B each show a schematic representation of a control circuit 200 according to various exemplary embodiments, FIG. 4 shows a schematic representation of control element arrangements 224, which can be part of a control circuit 200 according to various exemplary embodiments, and FIG. 5 shows a schematic representation of a control circuit 200 according to various exemplary embodiments. A better understanding can be gained if some of the figures are taken together, because parts of them are presented in a highly schematic way for better clarity.

The control circuit 200 can be provided to control a data input/output, for example, using a data input/output pad or a contactless data input/output device.

The control circuit 200 can have a plurality m of control level circuits that include at least one first control level circuit (m=1) and one last control level circuit (index m). Typically, more than two control level circuits can be provided, for example three, four or five control level circuits.

Each of the control level circuits can have at least one control element 224.

In FIGS. 2, 3A and 3B the control elements 224 are shown in a highly schematic form (as rectangles with two terminals). FIG. 3A at the top right and FIG. 3B at the bottom left (there with additional reference signs) illustrate symbolically, by way of inserts to be understood as a legend, how the schematic representation in the exemplary embodiments of FIG. 2, FIG. 3A and FIG. 3B is to be understood. Each rectangle symbolizes a gate (a transistor finger of the main driver transistor) of a transistor, with the gate being provided with two terminals 224A1, 224A2. The gate controls a channel that connects a source terminal 224S and a drain terminal 224D. These are symbolized in the legend as a light gray region or as dashes orthogonal to the gate and have been completely omitted in the "fir tree" representation.

In FIG. 4, one circuit is shown as selected for the individual control elements 224. There, each of the twelve control elements 224 shown is designed identically, so that for the sake of clarity, the designations of the terminals are distributed over several individual control elements 224.

In the figures, the control elements 224 are provided with indices (for the sake of clarity only partially, e.g. in FIG. 2 and FIG. 3A), which specify the control level circuit m and ordinal number within the control level circuit n, according to the schema 224_mn, for example, for the first control element of the fifth control level circuit 224_51.

For example, a number of control elements 224 can increase from control level circuit to control level circuit, or remain the same. To achieve a specific current curve profile, it may also be possible to decrease a number n of control elements 224 from one control level circuit to the next, provided that it is ensured that a number n(m) of control elements 224 of the last (m-th) control level circuit 224_m is greater than a number n(1) of control elements 224_1 of the first control level circuit.

FIG. 4 shows three exemplary control element arrangements, designated as first instance 224_Inst1 (bottom), second instance 224_Inst2 (center), and third instance 224_Inst3 (top).

The instances 224_Inst1 to 224_Inst3 can be used as main driver transistors for data input/output. Accordingly, according to various exemplary embodiments the control circuit 200 which uses the control element arrangements of the instances 224_Inst1 through 224_Inst3 can also be referred to as a data input/output unit.

The control element arrangement of the first instance 224_Inst1 contains one control element 224 in each of the first three control level circuits and 24 control elements 224 in the fourth and last control level circuit, resulting in a total of 27 double-finger transistors. This provides a strong driver (i.e. a high DC current (in the exemplary embodiment approximately 31 mA) is enabled) with a steep/fast rising current edge for high data frequencies.

The control element arrangement of the second instance 224_Inst2 contains one control element 224 in each of the first two control level circuits, two control elements 224 in the third control level circuit, and five control elements 224 in the fourth and last control level circuit, resulting in a total of nine double-finger transistors. This provides a medium-strength driver (i.e. a medium DC current (in the exemplary embodiment, approximately 6 mA) is enabled) with a medium-fast current rise for low data frequencies.

The control element arrangement of the third instance 223_Inst3 contains one control element 224 in the first control level circuit, two control elements 224 in the second control level circuit, five control elements 224 in the third control level circuit, and ten control elements 224 in the fourth and last control level circuits, resulting in a total of 18 double-finger transistors. This provides a strong driver (i.e., a high DC current (in the exemplary embodiment, approximately 17 mA) is enabled) with a medium-steep rising current edge for medium data frequencies.

The left-hand side of FIG. 4 shows the N and P inputs which form the top of the "fir tree", and shown on the right are the outputs and below each one the booster input (which form the base of the "fir tree").

Each of the control elements 224 can be configured to receive a first control signal and a second control signal and to control a current for the data input/output which flows between the source 224S and drain 224D, depending on the first control signal and the second control signal.

In FIGS. 3A and 3B the exemplary transistors of the control elements 224 are each equipped with a first gate terminal 224A1 and a second gate terminal 224A2. The first gate terminals 224A1 can each be arranged on a first side of a channel switched by the gate and the second gate terminals 224A2 can each be arranged on a second side of the channel located opposite the first side.

The first control signal can be provided at the first gate terminal 224A1 of each gate, and the second control signal can be provided at each second gate terminal 224A2 of the same gate.

The control circuit 200, as described graphically above, can be configured to provide the first control signal to the respective control elements (i.e. the control elements 224_1 first and the control elements 224_m last) in a sequence starting at the first control level circuit and ending at the last control level circuit, and then to provide the second control signal at least to the last control level circuit in reverse order of the control level circuits (i.e. firstly to the control elements 224_m of the last control level circuit and then, if applicable, to the control elements 224 in descending order of the control level circuit up to the first control level circuit).

The signals can be provided automatically or passively in various exemplary embodiments, for example by means of a capacitive coupling, i.e. the second gate terminal 224A2 of a preceding gate can be electrically conductively connected to the first gate terminal 224A1 of a subsequent gate to provide the first control signal. Furthermore, a signal at the second gate terminal 224A2 of the control elements 224_m of the last control level circuit can be used to directly switch a (stronger) control signal, which is fed to these second gate terminals 224A2 of the control elements 224_m of the last control level circuit as the second control signal.

According to an alternative exemplary embodiment, the control elements can be switched indirectly or actively, for example by feeding a signal at one of the gate outputs to a controller which feeds the first control signal to the next gate, and then vice versa for the second control signal.

According to another exemplary embodiment, an active and a passive provision of the control signal can be combined, for example by passively activating the control level circuit s in the forward direction, then actively providing a control signal for switching over to the reverse direction, and finally passively activating the control level circuit s in the reverse direction, or, for example, by activating the control level circuits actively in the forward direction, then passively providing a control signal for switching over to the reverse direction, and finally activating the control level circuits actively in the reverse direction.

For the data input/output, an intensity of the current can be increased by providing the second control signal.

In other words, the control elements 224, in particular in the higher control level circuits, might not be switched by the first control signal completely to the conductive state for the current for the data input/output, but only to a partially conductive state. For example, a portion of the maximum drivable current that is provided after only the first control signal is provided can be between 30% and 80%. The highest proportion can be achieved at the lowest control level circuit, and the lowest proportion at the highest control level circuit.

One cause of this may be parasitic capacitances, which can attenuate the first control signal transmitted by control elements 224 of one control level circuit to the control elements 224 of the following control level circuit, so that, for example, after the first control level circuit the first control signal may be too weak to switch the control elements 224 of the following control level circuit to a state of minimum achievable resistance.

For switching the control elements 224 (at least for the at least one control element 224_1 of the first control level circuit in the first direction and the control elements 224_m of the last control level circuit in the reverse direction—the subsequent control elements 224 can each be switched by the control elements 224 of the previous control level circuits), at least one ballast circuit 222 can be provided as part of the control circuit 200. This can have an A-part 222A for switching the control elements 224 in the forward direction, and a B-part 222B for switching the control elements 224 in the reverse direction.

FIG. 5 shows the ballast circuit in more detail. For each of the three instances shown there (which can be constructed as CMOS in various exemplary embodiments, i.e. one control arrangement 224P based on PMOS transistors and an additional control element arrangement 224N based on NMOS transistors, see also FIG. 3A and FIG. 3B), two ballast circuit parts 222A/B can be provided in each case, namely one ballast circuit part 222A/B for the NMOS control element arrangement 224N and an additional ballast circuit part 222A/B for the PMOS control element arrangement 224P, so that the ballast circuit 222 can have a total of six (two times three) of the ballast circuit parts 222A/B shown in the lower half of FIG. 5.

For a different number of instances or if they are provided only as PMOS or only as NMOS circuits, the number of ballast circuit parts 222A/B can be changed accordingly.

A first control signal provided after the last control level circuit can still be strong enough, despite the parasitic capacitances, to cause the second control signal to be provided, for example to switch it by means of an additional transistor and to have it fed to the control elements 224_m of the last control level circuit.

When sequentially switching the control elements 224 in the control level circuits, the second control signal can also be attenuated due to parasitic capacitances. However, in various exemplary embodiments, the first switching signal and the second switching signal can be configured in such a way that a state of minimum achievable resistance can be switched by combining the first switching signal and the second switching signal at a control element 224.

Since a comparatively small number of control elements 224_1 is switched with the first control level circuit, and a comparatively high number of control elements 224_m with the last control level circuit, and the high number in the "reverse pass" is first switched to maximum conductivity, and only then, if applicable, the small number with the first control level circuit, the slow, uniform increase of the provided current can be achieved at the beginning and shortly before the maximum current is reached in conjunction with a boost-like, i.e. fast and strong, rising current approximately midway between the extreme values.

As also illustrated in FIG. 5, the control circuit 200 can comprise a plurality of control element arrangements (instances). The instances can, as illustrated in FIG. 4 and in FIG. 6 based on a simulation, have different properties in terms of how the controlled current is driven, for example, in terms of speed and maximum current reached, which can be achieved by the fact that when one instance is compared with another instance the number of control elements 224 differs in at least one control level circuit.

The control circuit 200 can be configured to switch each of the instances individually. This means, for example, that all instances can be connected together in parallel, only one of the instances, or a subset of the instances.

For a maximum current, i.e. the fastest switchover, all instances can be activated together. In the exemplary embodiment, the maximum current can form the sum of the maximum currents of the individual instances 1 to 3, i.e. for the exemplary embodiment illustrated in FIG. 4, a maximum current of 31 mA+17 mA+6 mA=54 mA can be supplied.

Figure 6:
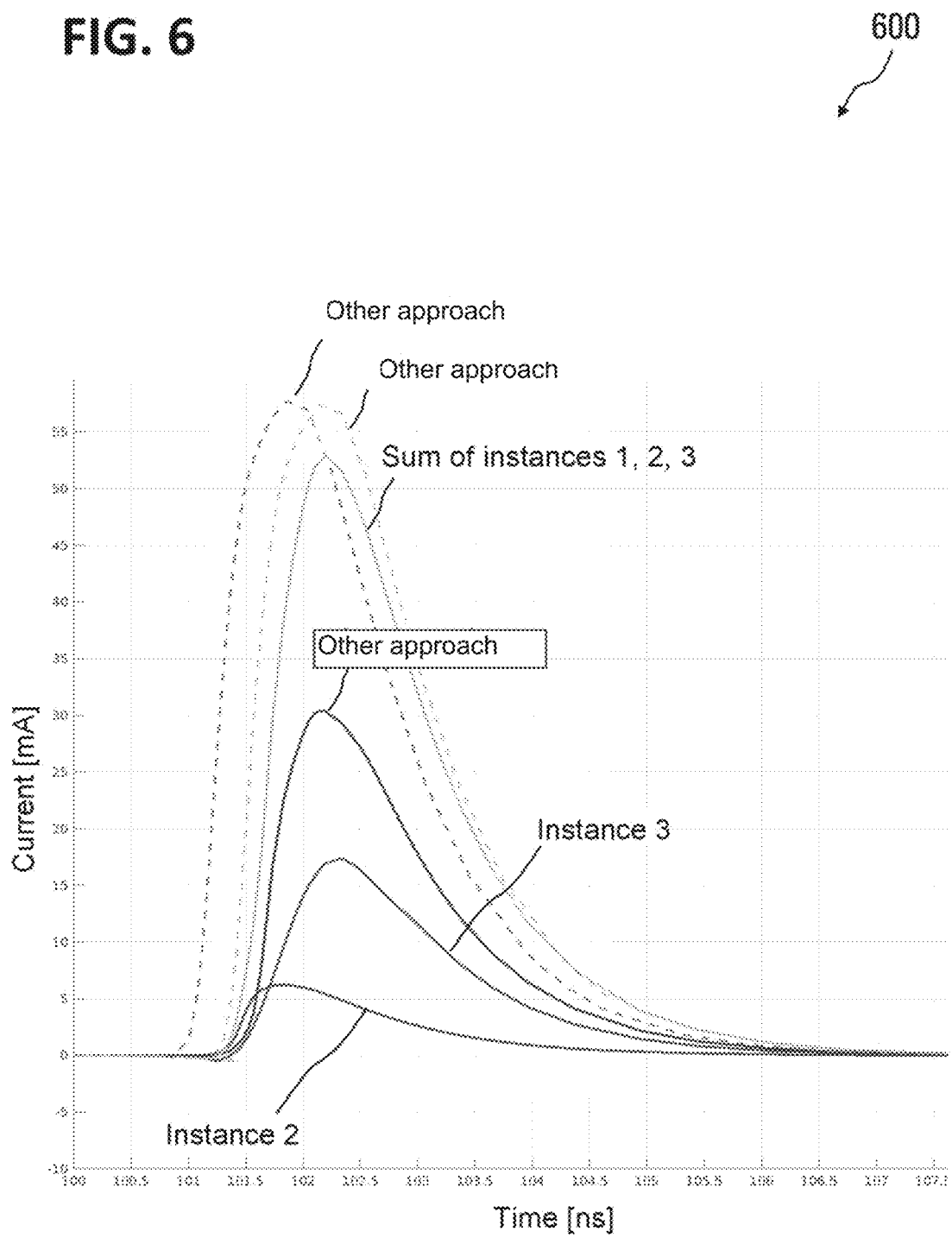
FIG. 6 shows a representation of simulation results for currents for a data input/output according to various exemplary embodiments compared to other approaches.

The summed signal according to a simulation of the exemplary embodiment from FIG. 4 is shown in FIG. 6 together with the individual signals. For comparison, a signal according to other approaches is shown there, slightly horizontally offset. The time offset is obtained for the same switching time (at approximately 101.5 ns) for the control circuit 200 and the control circuit according to other approaches, because by connecting together the double finger transistors of the three main driver transistors of a data input/output unit (see FIG. 4) the control circuit 200 generates a time delay (in this example, of approximately 500 ps). For a better comparison, the prior-art signal is shown once again with the same base point as the total signal according to the exemplary embodiment described in connection with FIG. 4, so that it can be seen that the summed signal initially rises more slowly than the signal according to other approaches, but both reach their maximum at about the same time, which in various exemplary embodiments is achieved by means of the boost approximately midway between the minimum current and the maximum current.

The comparison in FIG. 6 between the "adjusted" (to t=0, here t=101.5 ns) current signal curve according to other approaches (dashed) and the summed curve of instances 1 to 3 (solid line) illustrates that a delay (in this case about 300 ps) arises at switch-on, but this is completely made up again when the booster is switched on. In addition, the maximum current value of the circuit 200 according to various exemplary embodiments remains approximately 10% below the value of the other approaches.

Due to the targeted current adjustment during switchover (sinusoidal rise), no disadvantage arises due to the switchover delay. The switchover time does not become longer (ratio of switchover time to high/low bit-time), the result is only a shift of 500 ps, which is not critical in the data protocol since the entire period is shifted.

Furthermore, in various exemplary embodiments, e.g. depending on an application for which the data input/output is used, one or more of the instances can be switched while other instances remain unused. This allows great flexibility with regard to the data signal to be generated.

In several exemplary embodiments, with less flexibility the control circuit 200 can be deployed with only one control element arrangement 224 (or even with two).

Controlling a data input/output using a control circuit 200, as shown in the example in FIG. 3A or FIG. 3B (that is, with a single control element in the first control level circuit 224_1, two control elements in the second control level circuit 224_2, four control elements in the third control level circuit 224_3, eight control elements in the fourth control level circuit 224_4, and sixteen control elements in the fifth control level circuit 224_5) can proceed according to the following illustrative description.

The gates, which are parts of the transistors that make up the control elements 224, can be used as RC elements (i.e. the gate resistance and gate capacitance in combination with source-drain) to provide a slow start for supplying the current for the data input/output (using the single transistor 224_11 in the first control level circuit) and a subsequent avalanche-like increased speed (using the sixteen transistors connected in parallel in the fifth control level circuit).

The $R_{DSon}$ value (or its reciprocal) in this case is formed by means of the number of transistor fingers activated per time unit.

When switching on, the "fir tree" is switched on at the narrow end (i.e. the gate at the individual transistor of the first control level circuit), while the wide end of the "fir tree" (i.e. the sixteen transistors of the fifth switching stage) can be in a tristate condition (e.g. not connected to any potential).

After the gate potential has moved slowly through the driver gates of the 32 transistors in the five control level circuits and by providing the gate control signal at the respective gate inputs of the transistors has switched the respective channels controlled by the gates to a partially conducting state, the gates of the transistors in the fifth control level circuit are ultimately switched to the same potential as the gate of the transistor in the first control level circuit, namely by additionally providing a second control signal at a second gate input of the respective gates.

In other words, the "fir tree" is additionally activated from the wide end. This can occur at point 3, which is illustrated in FIG. 1B. The additional switching from the wide end can be: delayed by a time constant (in relation to the transistor model used) (delay control); or carried out by means of an output level voltage return circuit (which measures an output voltage saturation point of the load capacitor), in this case the output voltage value is read between 50 and 66% and at this point the second side of the fir tree (wide base of the fir tree structure of the single finger transistors of the main transistor) is switched on in addition to the top of the fir tree.

The partially charged load capacity is now recharged more rapidly in order to make up for the recharging delay when switching on.

This means that the overall switching times of the load capacity are compensated by this boost circuit and are not any longer.

FIG. 7 shows a flowchart of a method for controlling a data input/output according to various exemplary embodiments.

The method can comprise controlling a data input/output using a plurality of control level circuits that have at least one first and one last control level circuit, with each control level circuit having at least one control element, with a number of control elements of the last control level circuit being greater than a number of control elements of the first control level circuit, wherein the method comprises providing a first control signal to the respective control elements in a sequence starting at the first control level circuit and ending at the last control level circuit, to provide a current for the data input/output (710) and then providing a second control signal in reverse order to the control elements of at least the last control level circuit, wherein a current intensity of the current provided for the data input/output is increased by the provision of the additional control signal (720).

In the following text, a summary of some exemplary embodiments is given.

In exemplary embodiment 1 a control circuit is provided for controlling a data input/output. The control circuit can have a plurality of control level circuits that have at least one first and one last control level circuit, with each control level circuit having at least one control element, with a number of control elements of the last control level circuit being greater than a number of control elements of the first control level circuit, each of the control elements being configured to receive a first control signal and a second control signal and to control a current for the data input/output depending on the first control signal and the second control signal, and the control circuit being configured to provide the first control signal to the control elements in sequence starting at the first control level circuit and ending at the last control level circuit, and then to provide the second control signal at least to the last control level circuit in reverse order of the control level circuits, wherein a current intensity of the current provided for the data input/output is increased by providing the additional control signal.

Exemplary embodiment 2 is a control circuit according to exemplary embodiment 1, wherein each of the control elements has at least one transistor.

Exemplary embodiment 3 is a control circuit according to exemplary embodiment 1 or 2, wherein the first control signal is provided at a first gate terminal of each gate.

Exemplary embodiment 4 is a control circuit according to exemplary embodiment 3, wherein the second control signal is provided at a second gate terminal of the same gate.

Exemplary embodiment 5 is a control circuit according to exemplary embodiment 4, wherein the first gate terminals are arranged on the first side of a channel switched by the gate and the second gate terminals are each arranged on a second side of the channel located opposite the first side.

Exemplary embodiment 6 is a control circuit according to any one of exemplary embodiments 1 to 5, wherein each of the control elements is formed as a CMOS element.

Exemplary embodiment 7 is a control circuit according to any one of exemplary embodiments 1 to 6, which is additionally configured to switch the second control signal by means of the first control signal at the control elements of the last control level circuit.

Exemplary embodiment 8 is a control circuit according to exemplary embodiment 7, which also comprises at least one additional transistor configured to switch the second control signal.

Exemplary embodiment 9 is a control circuit according to one of the exemplary embodiments 1 through 8, wherein each of the control elements is configured to provide only a portion of the maximum amount of current that the control element can supply for data input/output when only the first control signal is provided.

Exemplary embodiment 10 is a control circuit according to exemplary embodiment 9, wherein the portion is between 30% and 80%.

Exemplary embodiment 11 is a control circuit according to exemplary embodiment 9 or 10, wherein the portion decreases in the sequence of control level circuits.

Exemplary embodiment 12 is a control circuit according to one of the exemplary embodiments 1 to 11, wherein each of the control elements is configured to provide the maximum amount of current that the control element can provide for data input/output when both the first control signal and the second control signal are provided to the control element.

Exemplary embodiment 13 is a control circuit according to one of the exemplary embodiments 1 to 12, which further comprises an additional plurality of control level circuits formed in the same way as the plurality of control level circuits, except that the number of control elements in at least one control level circuit of the plurality of control level circuits is different from the number of control elements in the corresponding control level circuit of the additional plurality of control level circuits, the additional plurality of control level circuits being connected in parallel to the plurality of control level circuits.

Exemplary embodiment 14 is a control circuit according to exemplary embodiment 13, which further comprises a pre-driver circuit, which is configured to switch the plurality of control level circuits and/or the additional plurality of control level circuits into a switchable state.

Exemplary embodiment 15 is a control circuit according to one of the exemplary embodiments 1 to 14, which further comprises a data input/output pad or a contactless data input/output element to which the current is supplied.

Exemplary embodiment 16 is a method for controlling a data input/output using a plurality of control level circuits that have at least one first and one last control level circuit, with each control level circuit having at least one control element, with a number of control elements of the last control level circuit being greater than a number of control elements of the first control level circuit, wherein the method comprises providing a first control signal to the respective control elements in a sequence starting at the first control level circuit and ending at the last control level circuit, to provide a current for the data input/output and then providing a second control signal in the reverse sequence to the control elements of at least the last control level circuit, wherein a current intensity of the current provided for the data input/output is increased by providing the additional control signal.

Exemplary embodiment 17 is a method according to exemplary embodiment 16, wherein each of the control elements has at least one transistor.

Exemplary embodiment 18 is a method according to exemplary embodiment 16 or 17, wherein the first control signal is provided at a first gate terminal of each gate.

Exemplary embodiment 19 is a method according to exemplary embodiment 18, wherein the second control signal is provided at a second gate terminal of the same gate.

Exemplary embodiment 20 is a method according to exemplary embodiment 19, wherein the first gate terminals are each arranged on the first side of a channel switched by the gate and the second gate terminals are each arranged on a second side of the channel located opposite the first side.

Exemplary embodiment 21 is a method according to any one of exemplary embodiments 16 to 20, wherein each of the control elements is formed as a CMOS element.

Exemplary embodiment 22 is a method according to any one of exemplary embodiments 16 to 21, further comprising: switching the second control signal by means of the first control signal provided at the control elements of the last control level circuit.

Exemplary embodiment 23 is a method according to exemplary embodiment 22, wherein the control circuit also has at least one additional transistor, the method comprising: switching the second control signal by means of the transistor.

Exemplary embodiment 24 is a method according to one of the exemplary embodiments 16 to 23, which further comprises providing only a portion of the maximum amount of current that the control can provide for data input/output when providing only the first control signal.

Exemplary embodiment 25 is a method according to exemplary embodiment 24, wherein the portion is between 30% and 80%.

Exemplary embodiment 26 is a method according to exemplary embodiment 24 or 25, wherein the portion decreases in the sequence of the control level circuits.

Exemplary embodiment 27 is a method according to one of the exemplary embodiments 16 to 26, which further comprises providing the maximum current that the control element can provide for the data input/output when both the first control signal and the second control signal are provided at the control element.

Exemplary embodiment 28 is a method according to one of the examples 16 to 27, wherein the control circuit also has an additional plurality of control level circuits formed in the same way as the plurality of control level circuits, except that the number of control elements in at least one control level circuit of the plurality of control level circuits is different from the number of control elements in the corresponding control level circuit of the additional plurality of control level circuits, the additional plurality of control level circuits being connected in parallel to the plurality of control level circuits.

Exemplary embodiment 29 is a method according to exemplary embodiment 28, which also comprises switching the plurality of control level circuits and/or the additional plurality of control level circuits to a switchable state.

Additional advantageous designs of the device are obtained from the description of the method and vice versa.

What is claimed is:

1. A control circuit for controlling data input/output, comprising:
   a plurality of control level circuits that include a first control level circuit and a last control level circuit, each of the control level circuits having at least one control element;
   wherein a first number of control elements of the first control level circuit is less than a second number of control elements of the last control level circuit;
   wherein each of the control elements is configured to receive a first control signal and a second control signal and is further configured to control a current for the data input/output based on the first control signal and the second control signal;
   wherein the control circuit is configured to provide the first control signal to the respective control elements in a sequence starting at the first control level circuit and ending at the last control level circuit, and then to provide the second control signal in a reverse order which starts at the last control level circuit and ends at the first control level circuit.

2. The control circuit as claimed in claim 1, wherein each of the first number of control elements and the second number of control elements includes a transistor including a first gate terminal and a second gate terminal.

3. The control circuit as claimed in claim 2, wherein the first control signal is provided at the first gate terminal of the transistor for each of the control elements.

4. The control circuit as claimed in claim 3, wherein the second control signal is provided at the second gate terminal of the transistor for each of the control elements.

5. The control circuit as claimed in claim 2, wherein the first gate terminal is arranged on a first side of a channel region of the transistor and the second gate terminal is arranged on a second side of the channel region located opposite the first side.

6. The control circuit as claimed in claim 2, wherein the transistor is a metal oxide semiconductor field effect transistor (MOSFET).

7. The control circuit as claimed in claim 1, wherein the control circuit is further configured to switch the second control signal to the control elements of the last control level circuit based on the first control signal and apply the second control signal concurrently with the first control signal, such that a current intensity for the data input/output is increased by provision of the second control signal compared to when only the first control signal is provided.

8. The control circuit as claimed in claim 7, further comprising
   at least one additional transistor which is configured to switch the second control signal.

9. The control circuit as claimed in claim 7,
   wherein each of the control elements is configured, when providing only the first control signal, to supply only a portion of a maximum amount of current that the control element can supply for the data input/output.

10. The control circuit as claimed in claim 9,
    wherein the portion is between 30% and 80%.

11. The control circuit as claimed in claim 9,
    wherein the portion decreases in the sequence of the control level circuits.

12. The control circuit as claimed in claim 1,
    wherein each of the control elements is configured to provide a maximum amount of current that the control element can provide for the data input/output when both the first control signal and the second control signal are provided to the control element.

13. The control circuit as claimed in claim 1, further comprising:
    an additional plurality of control level circuits corresponding to the plurality of control level circuits, except that the number of control elements in at least one control level circuit of the plurality of control level circuits differs from the number of control elements in the corresponding control level circuit of the additional plurality of control level circuits,
    the additional plurality of control level circuits being connected in parallel to the plurality of control level circuits.

14. The control circuit as claimed in claim 13, further comprising:
    a pre-driver circuit configured to switch the plurality of control level circuits and/or the additional plurality of control level circuits into a switchable state.

15. The control circuit as claimed in claim 14, further comprising:
    a data input/output pad or a contactless data input/output element at which the current is supplied.

16. The control circuit as claimed in claim 15,
    wherein the first control signal is provided via capacitive coupling.

17. A method for controlling a data input/output using a plurality of control level circuits including at least one first control level circuit and one last control level circuit, wherein each control level circuit has at least one control element, wherein a number of control elements of the last control level circuit is greater than a number of control elements of the first control level circuit, the method comprising:
    providing a first control signal to each control element in a first sequence starting at the first control level circuit and ending at the last control level circuit, to provide current at a first current level for the data input/output; and
    subsequently providing a second control signal in a second sequence to the control elements of at least the last control level circuit, to provide current at a second current level for the data input/output, the second current level being greater than the first current level.

18. The method as claimed in claim 17,
wherein each of the control elements includes a transistor including a first gate terminal and a second gate terminal.

19. The method as claimed in claim 18,
wherein the first gate terminals of the control elements are each arranged on a first side of a channel region and the second gate terminals are each arranged on a second side of the channel region located opposite the first side.

20. The method as claimed in claim 17,
wherein the second sequence has a reverse order relative to the first sequence;
wherein only the first control signal is provided to the control elements during the first sequence; and
wherein both the first control signal and the second control signal are provided concurrently to the control elements during the second sequence.

* * * * *